(12) United States Patent
Pain et al.

(10) Patent No.: US 7,897,308 B2
(45) Date of Patent: Mar. 1, 2011

(54) METHOD FOR TRANSFERRING A PREDETERMINED PATTERN REDUCING PROXIMITY EFFECTS

(75) Inventors: Laurent Pain, Saint Nicolas de Macherin (FR); Serdar Manakli, Grenoble (FR); Georges Bervin, Clermont-Ferrand (FR)

(73) Assignees: Commissariat a l'Energie Atomique, Paris (FR); Freescale Semiconductor, Inc., Austin, TX (US)

( * ) Notice: Subject to any disclaimer, the term of this patent is extended or adjusted under 35 U.S.C. 154(b) by 107 days.

(21) Appl. No.: 12/226,973

(22) PCT Filed: May 5, 2006

(86) PCT No.: PCT/IB2006/001670
§ 371 (c)(1),
(2), (4) Date: Nov. 14, 2008

(87) PCT Pub. No.: WO2007/129135
PCT Pub. Date: Nov. 15, 2007

(65) Prior Publication Data
US 2009/0162789 A1    Jun. 25, 2009

(51) Int. Cl.
*G03F 9/00* (2006.01)
*G03C 5/00* (2006.01)

(52) U.S. Cl. ............ 430/30; 430/296; 430/942; 250/492.2; 250/492.22; 250/492.23

(58) Field of Classification Search ............ 430/30, 430/296, 942; 250/492.2, 492.22, 492.23
See application file for complete search history.

(56) References Cited

U.S. PATENT DOCUMENTS

| 6,139,994 A | 10/2000 | Broeke |
| 6,649,452 B2 | 11/2003 | Lucas et al. |
| 6,759,666 B2 * | 7/2004 | Nagata et al. .......... 250/492.22 |
| 2006/0057471 A1 | 3/2006 | Schenau et al. |

FOREIGN PATENT DOCUMENTS

| EP | 1 180 784 A2 | 2/2002 |
| WO | WO 2004/090979 A2 | 10/2004 |

OTHER PUBLICATIONS

Satoh et al., "Performance Improvement in e-beam Reticle Writer HL-800M," *Proceedings of SPIE*, vol. 3096, Aug. 2007, pp. 72-83.
Pain et al., "65 nm Device Manufacture Using Shaped E-Beam Lithography," *Japanese Journal of Applied Physics*, vol. 43, No. 6B, Jun. 29, 2004, pp. 3755-3761.

* cited by examiner

*Primary Examiner*—Christopher G Young
(74) *Attorney, Agent, or Firm*—Oliff & Berridge, PLC

(57) ABSTRACT

A method for transferring a predetermined pattern onto a flat support performed by direct writing by means of a particle beam comprises at least: deposition of a photoresist layer on a free surface of the support, application of the beam on exposed areas of the photoresist layer, performing correction by modulation of exposure doses received by each exposed area, developing of the photoresist layer so as to form said pattern. Correction further comprises determination of a substitution pattern (11) comprising at least one subresolution feature and use of the substitution pattern (11) for determining the areas to be exposed when the electron beam is applied. In addition, modulation takes account of the density of the substitution pattern (11) near to each exposed area.

11 Claims, 9 Drawing Sheets

US 7,897,308 B2

METHOD FOR TRANSFERRING A PREDETERMINED PATTERN REDUCING PROXIMITY EFFECTS

BACKGROUND OF THE INVENTION

The invention relates to a method for transferring a predetermined pattern onto a flat support by direct writing by means of a particle or photon beam, and comprising at least:
deposition of a photoresist layer on a free surface of the support,
application of the beam on exposed areas of the photoresist layer,
performing correction by modulation of exposure doses received by each exposed area,
developing of the photoresist layer so as to form said pattern.

STATE OF THE ART

Electron Beam Lithography (EBL) is a lithography technique for direct writing on a flat support, i.e. a writing technique not requiring a mask. The flat support 1 is more often than not an optical lithography mask (or reticle) or a semiconducting substrate, for example made of silicon or silicon on insulator (SOI).

Thus, as represented in FIG. 1, transferring a pattern by E-beam lithography onto a flat support 1 is generally performed by means of a photoresist layer 2 arranged on a free surface of said support 1. An electron beam emitter 3 then produces an electron beam 4 (also noted E-beam 4) designed to be applied to predetermined areas of the photoresist layer 2. Said predetermined areas are also called the exposed areas of the photoresist layer 2 and they are determined by the pattern to be transferred 5. Thus, as represented by the block 6 in FIG. 1, the electron beam emitter 3 is controlled such that application of the electron beam 4 onto the photoresist layer 2 corresponds either to the pattern to be transferred 5 or to the complementary part thereof. For example, a pattern to be transferred 5 is represented in FIG. 3 and the hatched parts in FIGS. 4 and 7 represent the exposed areas of the photoresist layer 2 after application of the electron beam 4 to obtain the pattern to be transferred 5 in the support 1. In FIG. 4, the hatched parts correspond to the elements of the pattern to be transferred 5 whereas in FIG. 7 the hatched parts correspond to the complementary part of said pattern to be transferred 5.

Once exposure has been completed, the photoresist layer 2 is developed so as to free parts of the surface of the support 1. If the photoresist is a positive photoresist, the exposed areas of the photoresist layer are then eliminated in the developing step whereas, for a negative photoresist, the eliminated parts correspond to the non-exposed areas of the photoresist. The free parts of the flat support 1, i.e. the parts not covered by the photoresist after the developing step, are then etched so as to obtain a pattern corresponding to the pattern to be transferred 5 in the flat support.

E-beam lithography presents the advantage of being inexpensive and of obtaining a pattern presenting small dimensions, for example less than 10 nm. It is today extensively used in research laboratories, in particular for producing magnetic heads or, in the semi-conductor field, for producing the masks to be used in an optical lithography process.

This technique is however hardly used for producing integrated circuits directly on a semi-conducting wafer. It does in fact present a slow writing speed compared with the writing speed of an optical lithography.

Moreover, in this field of application and in a more general manner, the size of the pattern produced must be perfectly well controlled. Dimensional control of a pattern does however require very precise control of the proximity phenomena liable to occur when the electron beam is applied to the photoresist layer.

The proximity effects in an electron beam lithography process can at present be reduced by modulating the exposure dose received by the photoresist layer according to the writing density, i.e. according to the density of the pattern to be produced, near the area to be exposed.

In the article "Performance Improvement in E-beam Reticle Writer HL-800M", Hidetoshi Satoh et al. (SPIE Vol. 3096, pages 72-83) propose using proximity effect correction (PEC) hardware to obtain a pattern presenting sufficiently linear edges. Correction is performed directly during application of the electron beam on the photoresist layer. The exposed area of the photoresist layer is thus broken down into a grid of predetermined mesh. The writing density in each mesh is then calculated to then determine the value of the exposure dose to be applied for a given mesh during application of the electron beam.

As indicated by Laurent Pain et al. in the article "65 nm Device Manufacture Using Shaped E-Beam Lithography" (Japanese Journal of Applied Physics, Vol 43. No 6B, 2004), proximity effect correction can also be performed, on the same principle, by a proximity effect correction software such as the PROXECCO® software marketed by PDF solution.

Thus, as illustrated in FIG. 2, control 6 of the electron beam emitter 3 is more particularly achieved by previously entering the pattern to be transferred 5 into a control device and then performing correction by modulating the exposure dose according to the density of the pattern to be transferred 5, for example by means of the PROXECCO® software. The electron beam 4 is then applied to the photoresist layer 2 so as to expose predetermined areas of the photoresist layer before the latter is developed and the support 1 is etched.

The U.S. Pat. No. 6,649,452 proposes means for compensating the proximity effects liable to occur when a reticle, designed to transfer an integrated circuit pattern onto a semi-conductor wafer by optical lithography, is produced by E-beam lithography. These means consist in particular in adding additional features (subresolution design features) to the pattern to be transferred, to determine the areas of the photoresist layer to be exposed. These additional features are not resolved on the reticle and they can be of any type of shape and in any type of arrangement. However, the integrated circuit patterns produced on reticles according to the teachings of the U.S. Pat. No. 6,649,452 present dimensions four times larger than those of the final pattern transferred onto the semi-conducting wafer.

To produce a pattern presenting a size smaller than 70 nm on masks and integrated circuits, proximity effect correction does however remain difficult to achieve with these tools. Indeed, it does not enable a good dimensional control of said pattern to be obtained, i.e. within ±10% of the required size.

OBJECT OF THE INVENTION

The object of the invention is to provide a method for transferring a predetermined pattern onto a flat support, by E-beam lithography, remedying the shortcomings of the prior art. More particularly, it is the object of the invention to reduce the proximity effects in simple and efficient manner for any type of pattern to be transferred.

According to the invention, this object is achieved by the appended claims.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Generally speaking, the proximity effects observed are caused by a high backscattering electron ratio at the interface between the support 1 and the photoresist layer 2. It has however been observed that, whatever the type of photoresist used, whether it be negative or positive, the backscattering electron ratio depended essentially on the surface exposed. Thus, the larger the surface of the exposed area, the higher the backscattering electron ratio and therefore the greater the noise, which gives rise to detrimental proximity effects, poor pattern resolution and large dimensional variations.

Figure 1:
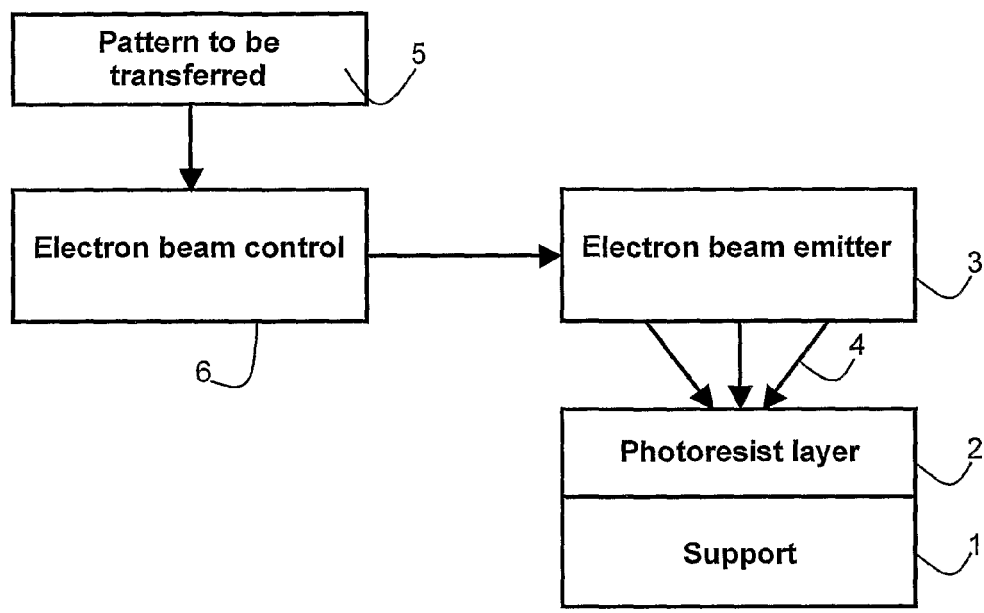
FIG. 1 schematically represents a particular embodiment of transfer of a pattern onto a support by E-beam lithography, according to the prior art, in block diagram form.
Figure 2:
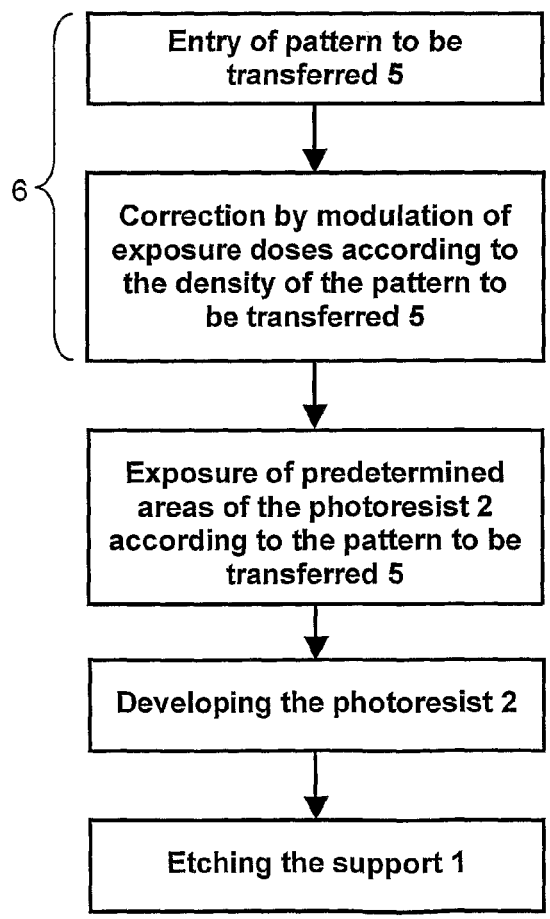
FIG. 2 schematically represents a particular mode of control of the electron beam according to the prior art, in block diagram form.
Figure 3:
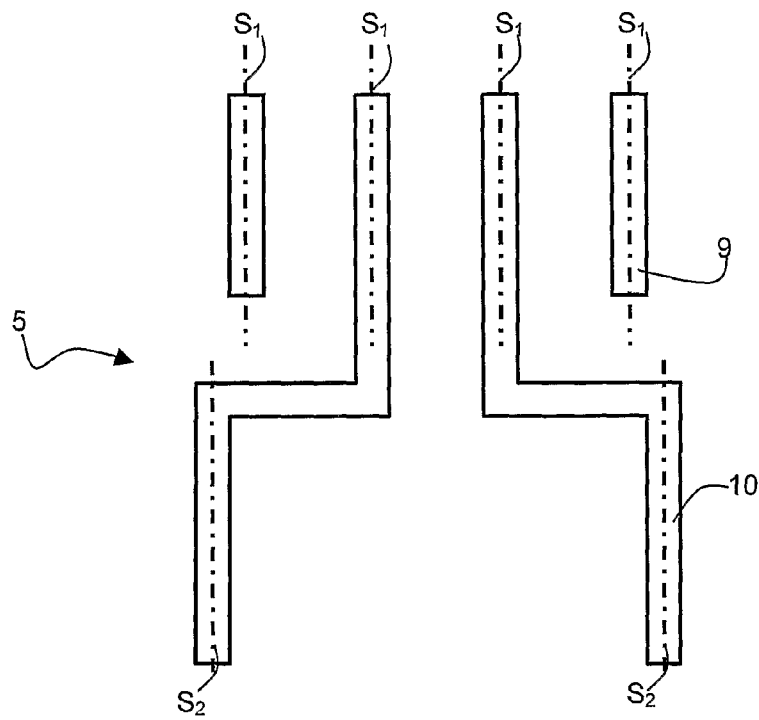
FIG. 3 schematically illustrates a top view of a pattern to be transferred.
Figure 4:
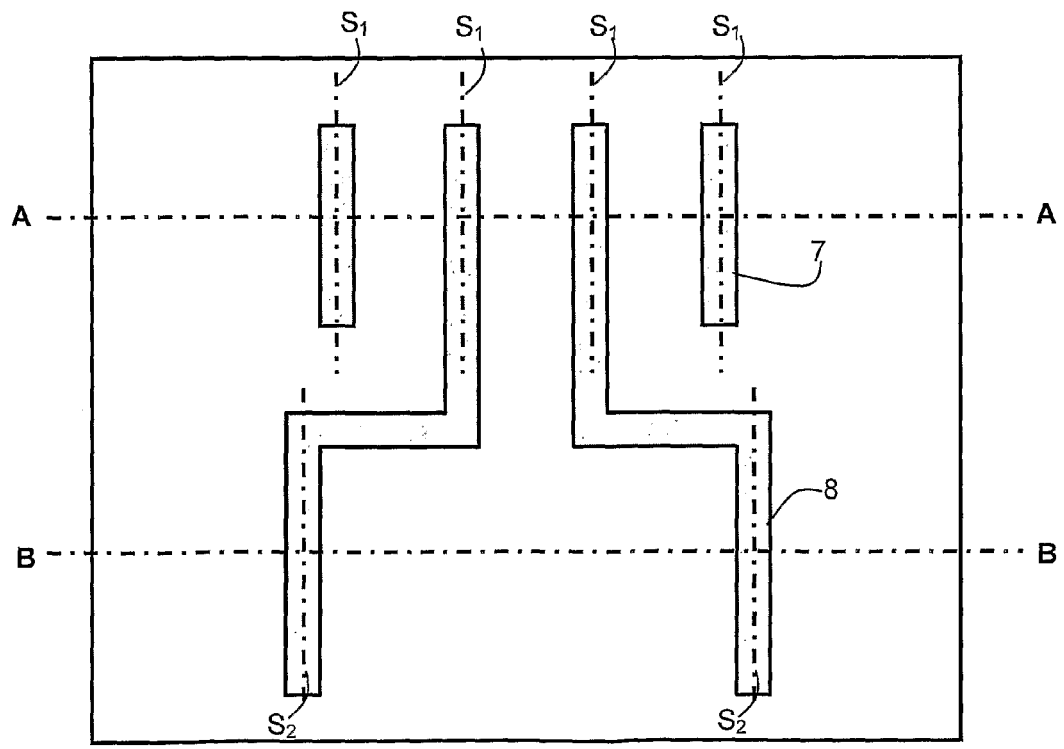
FIG. 4 schematically illustrates a top view of a first mode of exposure according to the prior art of a pattern to be transferred represented in top view in FIG. 3.
Figure 5:
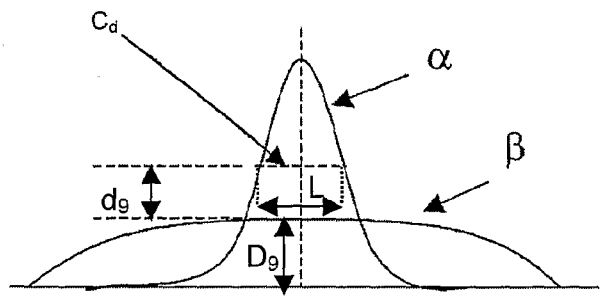
FIGS. 5 and 6 represent the distribution of forward electrons exposing the photoresist (curve α) and the variation of the backscattering electron ratio (curve β) for two portions, respectively dense and isolated, exposed according to FIG. 4.
Figure 6:
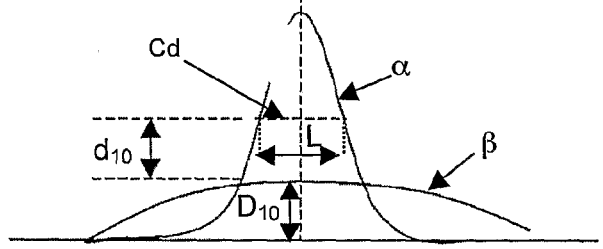

For example and as illustrated in FIGS. 4 to 6, a pattern to be transferred 5 such as the one represented in FIG. 3 is transferred according to the prior art onto a negative or positive photoresist layer 2. As represented in FIG. 4, exposure is performed in such a way that the exposed areas of the layer 2 correspond to said pattern 5. In FIG. 4, four exposed areas 7 are situated in a dense area, i.e. an area comprising a high density of elements to be transferred, and two exposed areas 8 are situated in an isolated area, i.e. comprising a low density of elements to be transferred. In a more general manner, it can be considered that the exposed areas 7 and 8 correspond respectively to dense portions 9 and to isolated portions 10 of the pattern to be transferred 5. Each dense portion 9 comprises a longitudinal axis $S_1$ and each isolated portion 10 comprises a longitudinal axis $S_2$.

The proximity effects can be evaluated by means of two curves α and β. Curve α represents the Gaussian distribution of the incident electron beam (forward electrons) produced by the emitter 3 and exposing the photoresist layer 2, centred on the axis of symmetry of the portion of the pattern to be transferred. Curve β represents the intensity of the ratio of backscattering electrons diffused by the support 1. Curve α enables a threshold $C_d$, called the photoresist threshold, to be determined corresponding to the size required for the portion of the pattern once the latter has been transferred, and the gradient of the curve α, at the level of said threshold, gives indications on the contrast. The width and height of the curve β represent the noise which could impact the resolution of possible transferred neighboring features and therefore cause proximity effects, but also roughness of the photoresist edges after transfer. Thus, the width and height of curve β must be minimal, which can not be obtained in one shot exposure, as present-day proximity effect correction solutions propose to do. In addition, the maximum height D of the curve β and the difference d between the threshold $C_d$ and said maximum can be very small, which indicates that the elements of the transferred pattern are poorly resolved or not resolved due to process window reduction and/or that they are rough, which is caused by the proximity effects.

The curves α and β have thus been represented in FIGS. 5 and 6 respectively for a dense portion 9 and for an isolated portion 10 of the pattern to be transferred 5, for the same threshold $C_d$, i.e. for transferred portions 9 and 10 having the same width L. It can thus be observed in FIGS. 5 and 6 that the difference $d_9$ is smaller than the difference $d_{10}$ and that the maximum $D_9$ is greater than the maximum $D_{10}$. Thus, in this case, the isolated portions 10 of the pattern to be transferred are better resolved on the support 1 than the dense portions 9 of said pattern and they will be subject to less proximity effects.

Figure 7:
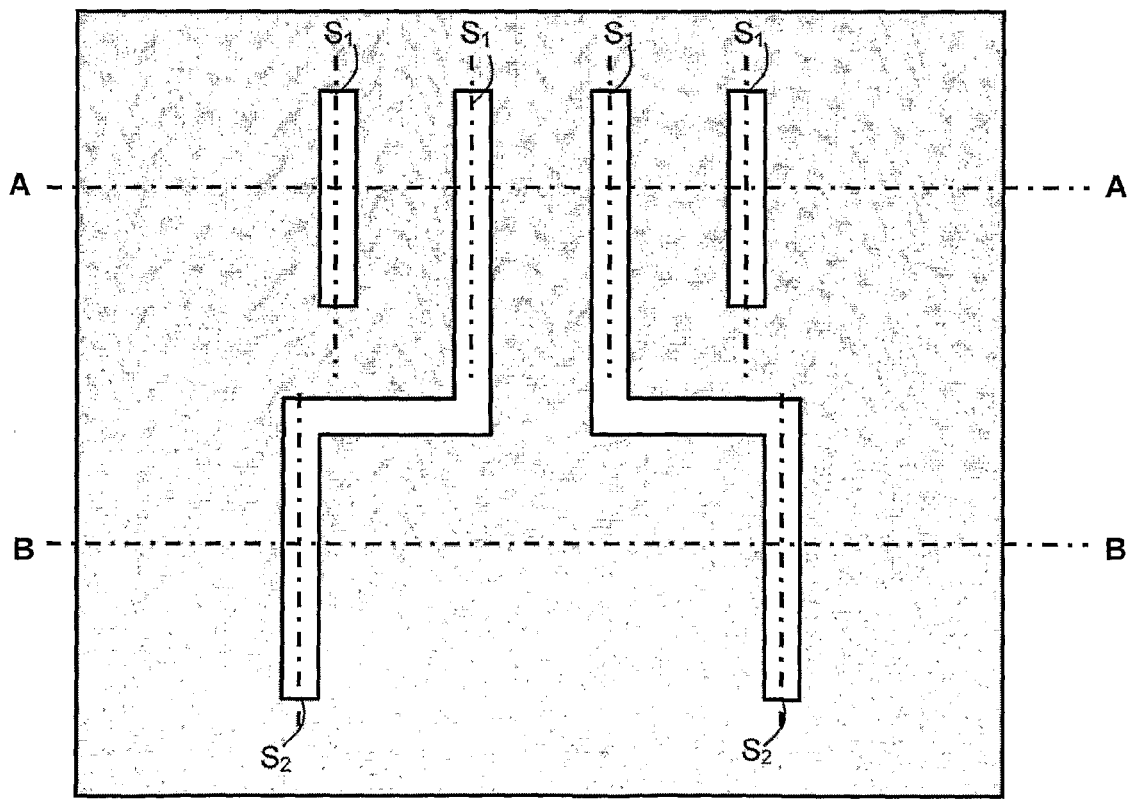
FIG. 7 schematically illustrates a top view of a second method of exposure according to the prior art of a pattern to be transferred according to FIG. 3.

It can be shown that the reverse phenomenon occurs if the pattern represented in FIG. 3 is transferred according to the prior art onto a positive photoresist layer 2, performing an exposure as illustrated in FIG. 7, i.e. exposing areas corresponding to the complementary part of the pattern 5. Proximity effects and poor resolution of the patterns will occur for the isolated portions 10 of said pattern 5 whereas the dense portions 9 will be protected. It can in fact be shown that, in this case, for the isolated portions 10, the energy level β is in the same order of magnitude as the threshold $C_d$, corresponding to the energy necessary to obtain the required size L of said portion. The noise energy level is such that the isolated portions 10 are totally exposed, which prevents their resolution.

The backscattering electron ratio and therefore the proximity effects thereby depend strongly on the width of the exposed area and on the density of features to be transferred. Thus, the backscattering electron ratio is high if the width of the exposed surface is large and vice-versa.

Figure 8:
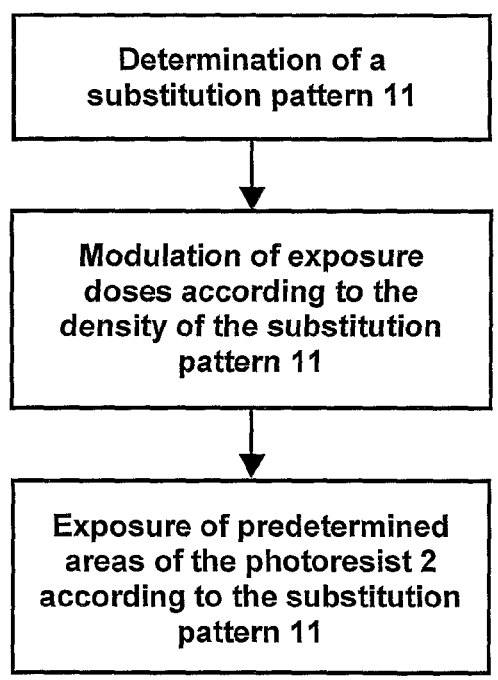
FIG. 8 schematically represents a particular method of control of an electron beam according to the invention in block diagram form.

The method for transferring according to the invention proposes to reduce the proximity effects in simple and efficient manner, whatever the shape of the pattern to be transferred 5. Thus, as represented in FIG. 8, control 6 of the electron beam used to perform transfer of a predetermined pattern 5 onto the flat support 1 is achieved, according to the invention, by replacing entry of the pattern to be transferred 5 by determination and entry of a substitution pattern 11 comprising at least one subresolution feature (also called fine element).

In this way, instead of determining the areas to be exposed when the electron beam 4 is applied according to the pattern to be transferred 5, as in the prior art, the method for transferring according to the invention uses a predetermined substitution pattern 11 comprising at least one subresolution feature.

Correction by modulating the exposure doses received by each exposed area thus takes account of the density of the substitution pattern 11, in proximity to each exposed area. Correction by modulating exposure doses can for example be performed using the PROXECCO® software.

The electron beam 4 is then applied on the photoresist layer 2 so as to expose predetermined areas of said layer in accordance with the substitution pattern 11. The photoresist layer 2 then undergoes a revelation step to free parts of the free surface of the support 1.

Determination of the substitution pattern 11 and determination of the subresolution feature or features depends in particular on the outline of the pattern to be transferred and on the exposure mode and/or the type of photoresist used.

According to a first embodiment, at least one portion of the pattern to be transferred 5 is replaced, in the substitution pattern 11, by a set of at least two subresolution features parallel to a longitudinal axis of said portion. Moreover, the exposed areas of the photoresist layer are formed by the substitution pattern 11. This first embodiment is more particularly suited to the case where the density of the pattern to be transferred 5 is high at the level of the portion to be replaced by a set of at least two subresolution features.

Figure 9:
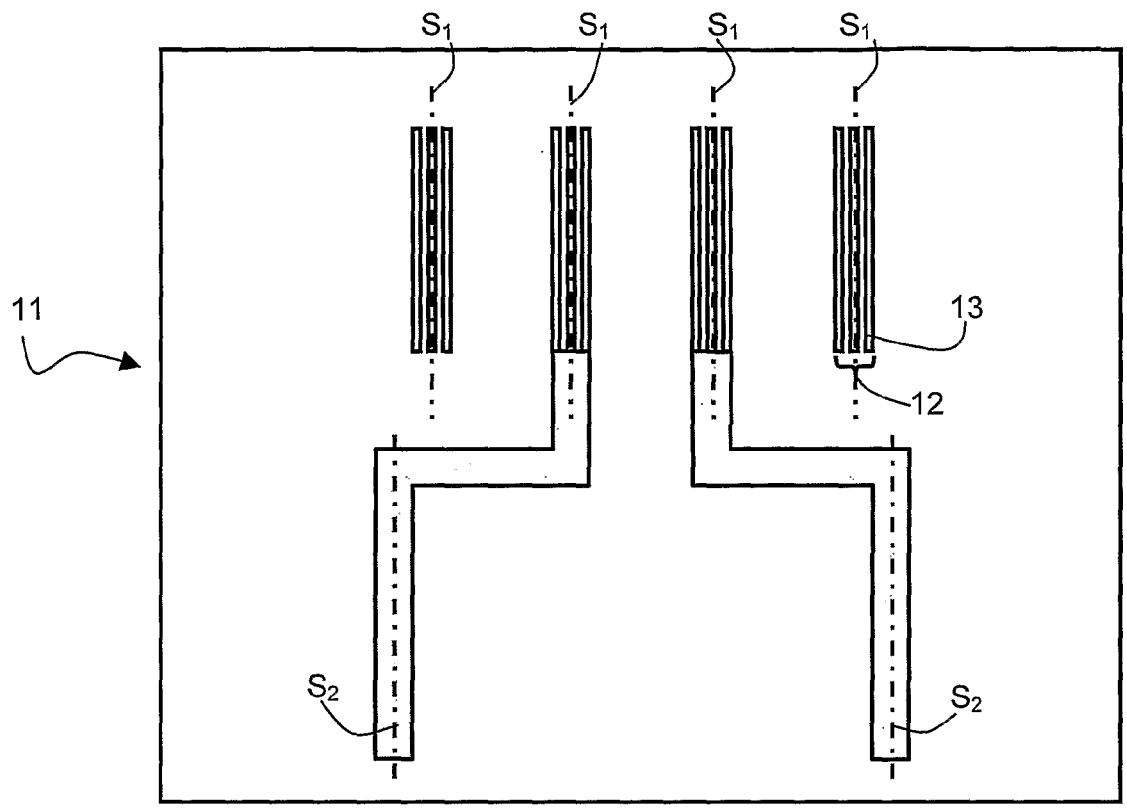
FIG. 9 schematically represents a top view of a first embodiment of a substitution pattern according to the invention.

As an example illustrated in FIG. 9, the substitution pattern 11 comprises four features 12. The features 12 replace the dense portions 9 in the pattern to be transferred 5 represented in FIG. 3. Each feature 12 thus has a longitudinal axis that coincides with the longitudinal axis $S_1$ of a corresponding dense portion 9. It is formed by three distinct, parallel and equidistant subresolution features 13. In addition, in FIG. 9, one of the subresolution features 13 is superposed on the corresponding axis $S_1$. The substitution pattern 11 comprises elements corresponding to the rest of the pattern to be transferred 5, and in particular the exposed areas 8 corresponding to the isolated portions 10. The subresolution features 13 of each set of features 12 present an identical length equal to the length of the associated dense portion 9. Furthermore, the width of each set of features 12 is equal to that of said the associated portion, after transfer. In some cases, the width of each set of features 12 can also be equal to that of said the associated portion of the pattern to be transferred.

The number of subresolution features 13 forming a set 12 is not limited to three. It is determined according to the width of the portion to be replaced. Moreover, determination of the width of each subresolution feature 13 can be performed empirically. For example, the number of subresolution features 13 constituting a set 12 is determined beforehand, then, for a constant pitch p between different dense portions 9 of fixed width L', the width L actually obtained on the support 1 is measured for different width values of the subresolution features 13 and distance values between two subresolution features 13. The width of the subresolution features and the distance between two subresolution features are then determined as soon as the value of the width L coincides substantially with that of the fixed width L'.

For example, dense portions 9 having a width L' of 60 nm and a pitch p between two dense portions 9 of 60 nm can each be replaced by a set 12 of three subresolution features 13 each having a width of 15 nm with a 7.5 nm spacing between two adjacent subresolution features 13 of said set 12.

Electron beam exposure is performed following a grid the pitch of which grid corresponds to a minimum unit proper to each application device or emitter used. Thus, if the emitter used presents a grid pitch having a fineness of 1 nm, such as for example the exposure device marketed under the name of LEICA, SB 350 DW, the 7.5 nm spacing can be obtained by performing two successive exposure steps, with spacings of respectively 7 nm and 8 nm between the adjacent subresolution features 13 of the sets 12, so as to obtain a mean spacing of 7.5 nm.

Dense portions 9 having a width L' of 60 nm and a pitch p between two dense portions 9 of 120 nm can each be replaced by a set 12 of three subresolution features 13 each having a width of 16 nm, with a 6 nm spacing between two subresolution features 13.

The first embodiment is particularly well suited for portions of patterns located in a dense environment and having a high backscattering electron ratio. The subresolution features are in fact of smaller sizes than the dense portion 9 and they present a low backscattering electron ratio compared with a dense portion 9. Moreover the set formed by the subresolution features 13 provides the energy necessary for formation of the pattern, at the required size.

Figure 10:
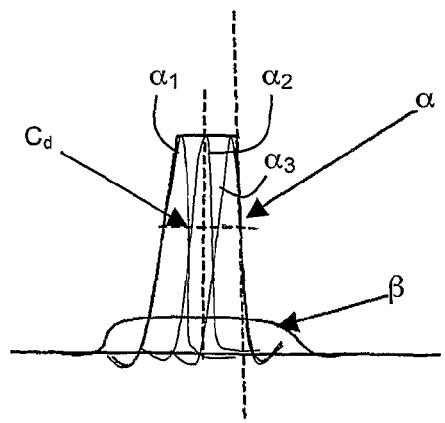
FIG. 10 represent the resultant curves α and β of a set of features of the substitution pattern according to FIG. 9.

In FIG. 10, the curves α and β represented correspond to superposition of the respective curves $α_1$, $α_2$, $α_3$, and $β_1$, $β_2$ and $β_3$ of each subresolution feature 13 of a set 12 as represented in FIG. 9 and designed to replace a dense portion 9. However, the curve a of the set 12 is finer than the curve a of a dense portion 9, as represented in FIG. 5. In addition, the gradient of the curve α of the set 12, at the level of the threshold $C_d$, is steeper than that of the dense portion 9, which indicates an improvement of the contrast of the transferred pattern. Furthermore, compared to the height and width of the curve α of a dense portion 9 (FIG. 5), the height and width of the curve β of the set 12 are very small, which indicates that the impact of the backscattering electrons has considerably decreased on account of the substitution pattern 11. Thus, the sum of the curves α of each subresolution feature 13 of a set 12 reproduces the replaced dense portion 9, while improving the lithographical performances. Correction by exposure dose modulation, performed in accordance with the substitution pattern 11 as represented in FIG. 9, is moreover facilitated due to the fact that the ruggedness range of the control device is increased.

According to a second embodiment, the substitution pattern 11 can be formed by the pattern to be transferred during a first electron beam application period, then by at least one subresolution feature during a second electron beam application period. The subresolution feature is parallel to a longitudinal axis of a portion of the pattern to be transferred and it presents a length equal to the length of said portion. The density of the pattern to be transferred is preferably high at the level of said portion and the exposed areas of the photoresist layer 2 are formed by the substitution pattern 11.

Figure 11:
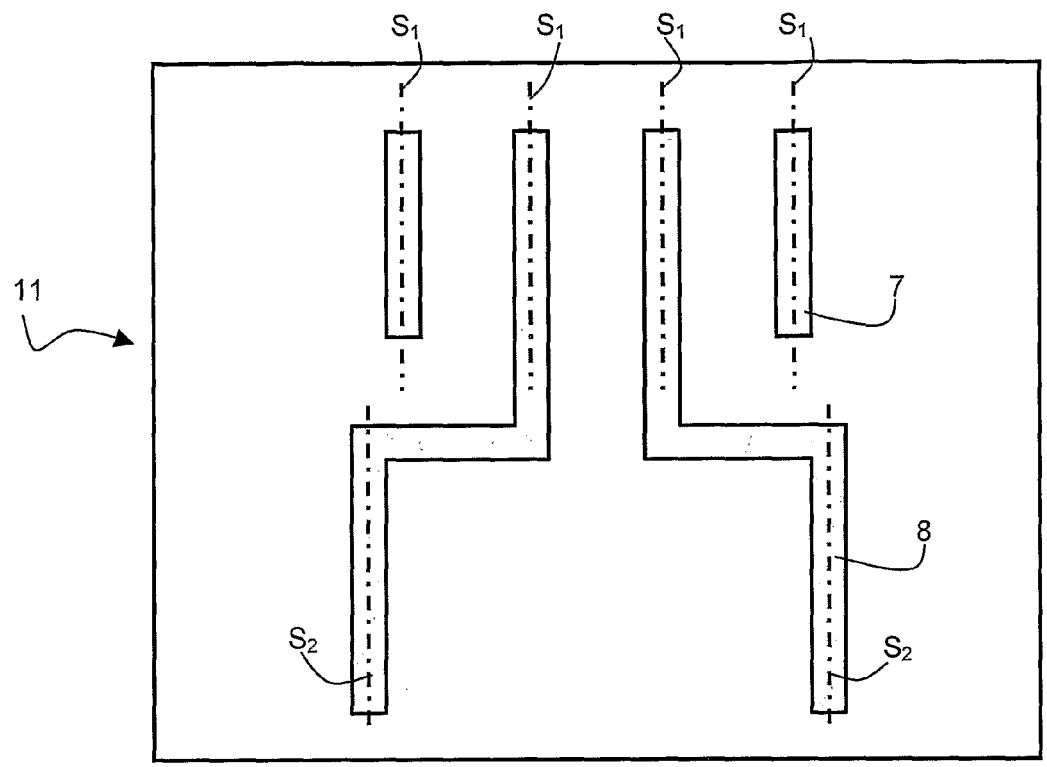
FIGS. 11 and 12 schematically represent top views of a second embodiment of a substitution pattern according to the invention, respectively at the end of a first exposure and of a second exposition to electronic irradiation.
Figure 12:
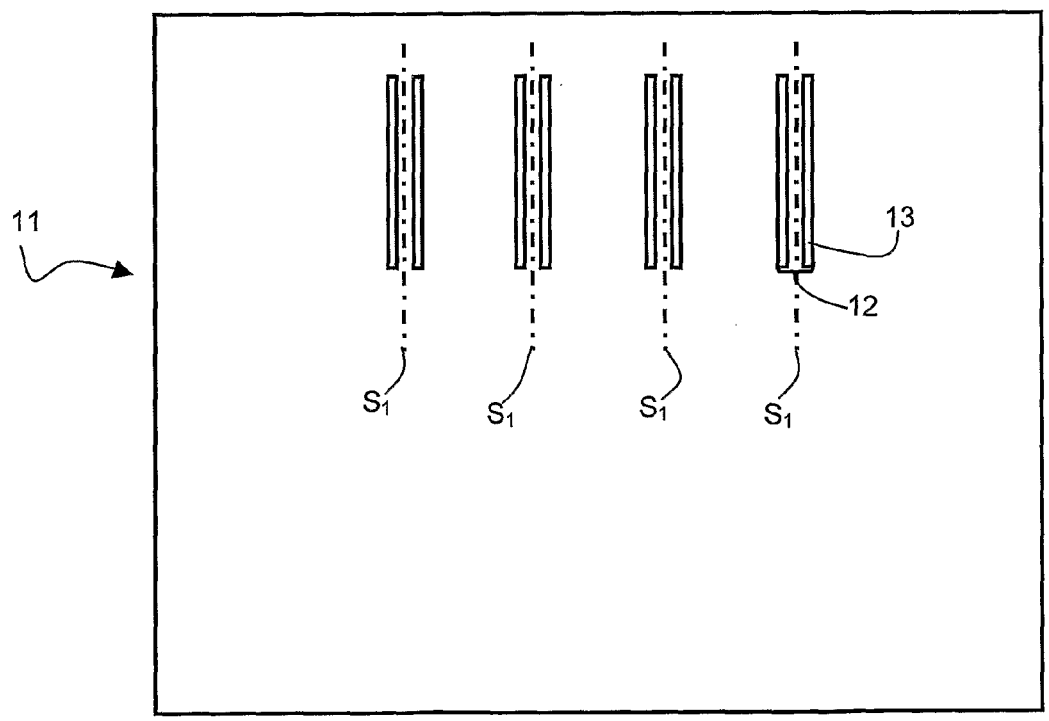
Figure 13:
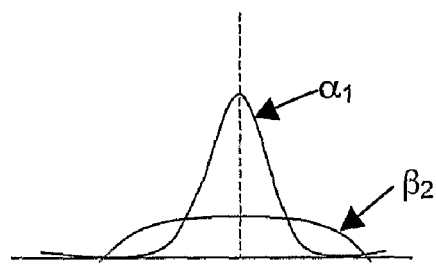
FIGS. 13 and 14 represent the curves ($α_1$ and $β_1$) and ($α_2$ and $β_2$ and $α_3$ and $β_3$) respectively for a dense portion and a set of features of a substitution pattern according to FIGS. 11 and 12, and FIG. 15 corresponds to superposition of the curves ($α_1$, $α_2$ and $α_3$) and ($β_1$, $β_2$ and $β_3$).
Figure 14:
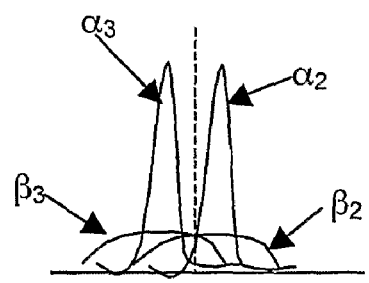
Figure 15:
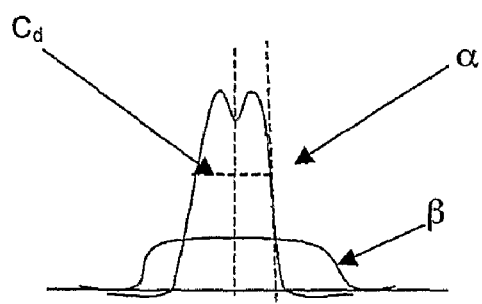

More particularly and as represented in FIGS. 11 and 12, the substitution pattern 11 is formed by the pattern to be transferred 5 during the first application period of the electron beam 4 and by a plurality of sets 12 respectively formed by two subresolution features 13 during the second application period. Each set 12 corresponds to a dense portion 9 of the pattern to be transferred 5. The two subresolution features 13 of each set 12 are then symmetrical with respect to the longitudinal axis $S_1$ of said corresponding portion 9 and the width of each set 12 is equal to that of said associated portion 9, after transfer. More particularly, the width of each set 12 can also be equal to that of said associated portion 9 of the pattern to be transferred. As represented in FIGS. 13 and 14, the exposure dose applied during the first application period is preferably lower than the exposure dose applied during the second application period. In this case, particular care must be taken over control 6 of the electron beam. Indeed, the areas of the photoresist layer 2, exposed during the first application period, have to be exposed again during the second application period, according to the set 12 associated with said portion 9. Thus, the two exposures must be perfectly superposed at the level of the dense portions 9, in order not to affect the final resolution of the pattern. It can also be observed in FIG. 15 that the gradient of the curve α is much steeper than that of the curve α according to FIG. 5, which indicates an improvement of the contrast. Furthermore, the width and height of the curve β are smaller than those of the curve β in FIG. 5. The second embodiment of the substitution pattern therefore provides an improvement of the contrast and a reduction of the noise and therefore of the proximity effects compared with a transfer method not comprising proximity effect correction.

Determination of the width of the subresolution features is preferably obtained empirically, for example by successively varying the exposure dose, the size of the subresolution features and the size of the space between said subresolution features. For example, for a dense portion 9 with a width of 45 nm separated from another dense portion 9 by a pitch of 90 nm, the set 12 can be formed by two subresolution features 13 with a width of 15 nm separated from one another by 30 nm.

Figure 16:
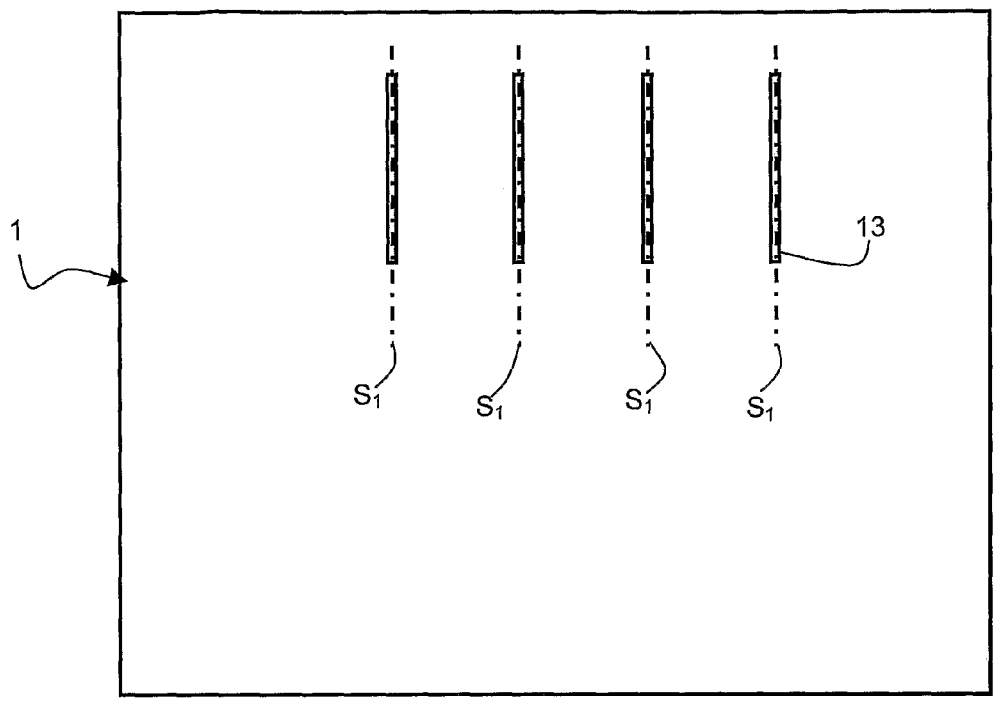
FIG. 16 schematically represents a top view of an alternative embodiment of a substitution pattern at the end of a second application period.
Figure 17:
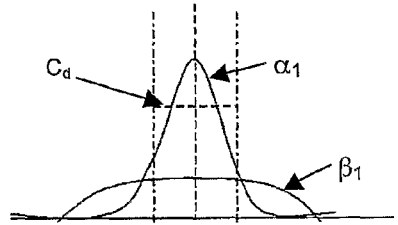
FIGS. 17 and 18 illustrate the curves ($α_1$ and $β_1$) and ($α'_2$ and $β'_2$) respectively for a dense portion and a subresolution feature of a substitution pattern according to FIGS. 13 and 16, and FIG. 19 corresponds to superposition of the curves ($α_1$ and $α'_2$) and ($β_1$ and $β'_2$).
Figure 18:
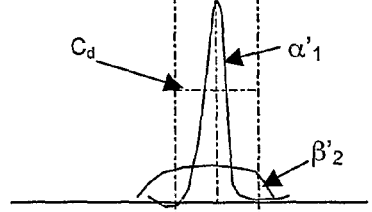

In an alternative embodiment represented by FIG. 16, the substitution pattern 11, during the second application period, can be formed by a plurality of sets 12 each comprising a single subresolution feature 13 superposed on the longitudinal axis S1 of said portion 9. For example, for a dense portion 9 with a width of 45 nm separated from another dense portion 9 by a pitch of 90 nm, a subresolution feature 13 can be used with a width of 9 nm the longitudinal axis whereof is superposed on that of the corresponding portion 9. For a portion 9 with a width of 60 nm separated from another portion 9 by a pitch of 120 nm, a subresolution feature 13 can be used with a width of 32 nm whereas for the same portion separated from another portion 7 by a pitch of 60 nm, the width of the subresolution feature can be 48 nm.

Figure 19:
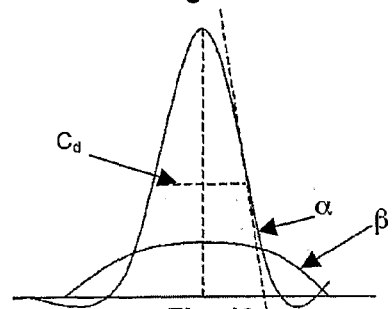

As for FIGS. 13 to 15, FIGS. 17 to 19 enable it to be observed that the exposure dose applied during the first application period is lower than that applied during the second application period. The gradient of the curve α in FIG. 19 is much steeper than that of the curve α in FIG. 5. Moreover, the width and height of the curve β in FIG. 19 are smaller than those of the curve β in FIG. 5. Thus, the alternative to the second embodiment of the substitution pattern also provides an improvement of the contrast and a reduction of noise and therefore of the proximity effects.

Figure 20:
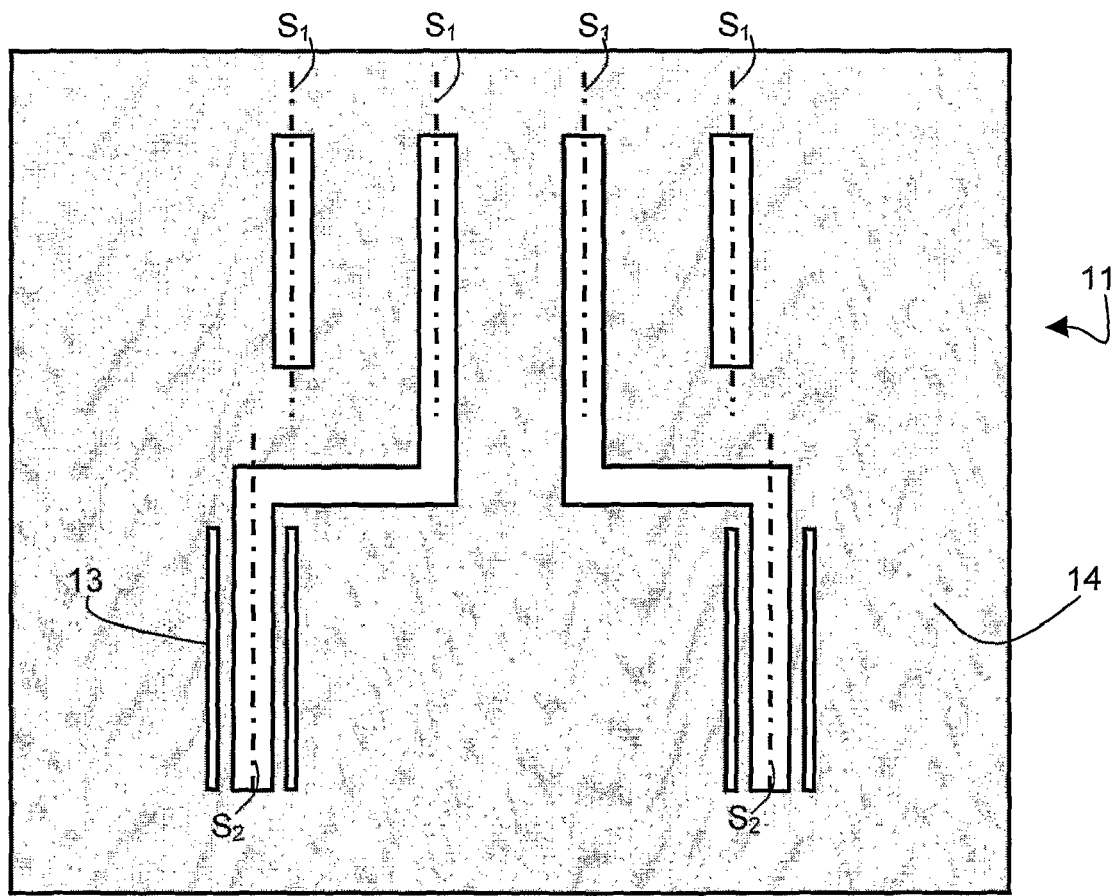
FIG. 20 schematically represents a top view of a third embodiment of a substitution pattern according to the invention.

In a third embodiment, the substitution pattern 11 is formed by the pattern to be transferred 5, completed by subresolution features 13 arranged outside at least one portion of the pattern to be transferred. More particularly and as represented in FIG. 20, the exposed areas of the photoresist layer are formed by the areas complementary to the substitution pattern 11. The portion completed by subresolution features 13 is an isolated portion 10, i.e. the density of the pattern to be transferred is low at the level of said portion. More particularly, the isolated portions 10 are surrounded by large exposure surfaces 14. Thus, the subresolution features 13 are arranged outside at least one isolated portion 10, in parallel manner to a longitudinal axis $S_2$ of said portion 10, in said exposure surfaces 14. They are situated near to said portion 10, for example at a distance less than 10 times the width of said portion.

The subresolution features 13 present a length smaller than or equal to the length of said portion. In addition, the number and/or width of each subresolution feature 13 and/or the distance between a subresolution feature and the corresponding portion and/or the width of said portion are determined according to the width of a complementary area of the pattern to be transferred adjacent to said portion. More particularly, these parameters are determined empirically. For a fixed value L' of a portion 10 of the pattern to be transferred 5, the result of the width L actually obtained on the support 1 as a function of the value W of the exposed surface can for example be noted. This makes it possible to determine the critical dimension from which the proximity effects begin for each value L', i.e. the size W from which a decrease of the actual value L is observed with respect to the fixed value L'. The size of the subresolution features and the distance between each subresolution feature and the portion 10 is then determined empirically. For each portion impacted by proximity effects, subresolution features are added having a width varying from 5 nm to 20 nm and/or a distance between each subresolution feature and the portion 10 that also varies. The required width and distance are obtained when the actual width L is equal to or close to the required value L.

For example, to obtain a portion 10 with a width of 40 nm achieved in a positive photoresist, two subresolution features with a width of 40 nm can be used arranged on each side of a longitudinal portion with a width of 80 nm, respectively at a distance of 40 nm from said longitudinal portion. The portion 10 obtained then presents a width of 40 nm and the subresolution features are not resolved when the photoresist layer is developed.

Unlike the embodiments described in the U.S. Pat. No. 6,649,452, the subresolution features of the third embodiment of the substitution pattern 11 are arranged close to isolated portions 10 in a large exposure surface and they have a length smaller than or equal to that of the portion 10. The arrangement of the subresolution features 13 enables the background noise to be locally reduced, whatever the size of the isolated portion, thus reducing the proximity effects and writing time while improving the contrast and resolution, in particular compared with the embodiment as represented in FIG. 7. In the U.S. Pat. No. 6,649,452, an isolated portion of the pattern to be transferred is arranged in a lattice of equidistant parallel lines. Certain lines are interrupted by the isolated portion so as to free a space around the whole periphery of the isolated portion. The presence of said lines enables the backscattering electron energy level to be homogenized.

According to the invention, it is possible to obtain a portion presenting a minimum size that can be less than 70 nm, whereas with the embodiments described in the U.S. Pat. No. 6,649,452 the portion obtained would have a minimum size of 130 to 140 nm.

The invention is not limited to the embodiments described above.

Thus, in the first and second embodiments, when the substitution pattern 11 comprises several subresolution features 13, the latter can have different widths. The set formed by the set of subresolution features 13 replacing a predetermined portion of the pattern to be transferred ($1^{st}$ embodiment) or the set formed by said portion during a first application period and by at least one subresolution feature formed during a second application period ($2^{nd}$ embodiment) can for example have a larger width, preferably larger by a maximum of 10%, than the width of the predetermined portion of the pattern to be transferred. Determination of this width is more particularly a function of the size of the pattern to be transferred and not of the grid of the emitter device. The chosen width is considered to be satisfactory when the transferred pattern has the required size, with a minimum line roughness of 3% with respect to said required size.

Furthermore, the lithography process can be replaced by any type of direct writing method and the electron beam can be replaced by a particle beam such as an ion beam or by a photon beam.

The invention claimed is:

1. Method for transferring a desired pattern onto a support by direct writing by means of a particle or photon beam, comprising:
    depositing a photoresist layer on the support,
    defining a substitution pattern comprising at least one subresolution feature located such that the substitution pattern defines an area of the photoresist layer scanned by the beam smaller than the desired pattern;
    exposing the photoresist layer with the beam according the substitution pattern instead of the desired pattern, using an exposure dose for the beam modulated according to the density of the substitution pattern; and
    developing of the photoresist layer to form the desired pattern.

2. Method according to claim 1, wherein the area of the photoresist layer scanned by the beam is comprised of the substitution pattern.

3. Method according to claim 2, wherein at least one portion of the desired pattern is replaced, in the substitution pattern, by a set of at least two separate subresolution features, parallel to a longitudinal axis of the at least one portion.

4. Method according to claim 2, wherein the substitution pattern is formed by the desired pattern during a first application period of the beam, then, during a second application period of the beam, by at least one subresolution feature, parallel to a longitudinal axis of a portion of the desired pattern and having a length equal to a length of the portion.

5. Method according to claim 4, wherein the subresolution feature is superposed on the longitudinal axis of the portion.

6. Method according to claim 4, wherein, during the second period, the substitution pattern associated with the portion is formed by a set formed by two separate subresolution features, symmetrical with respect to the longitudinal axis of the portion, a width of the set being equal to a width of the portion, after transfer.

7. Method according to claim 1, wherein the area of the photoresist layer scanned by the beam is comprised of a complement of the substitution pattern.

8. Method according to claim 7, wherein the substitution pattern is formed by a complement of the desired pattern, completed by subresolution features arranged outside a portion of the complement of the desired pattern, parallel to a longitudinal axis of the portion and having a length smaller than or equal to a length of the portion.

9. Method according to claim 8, wherein at least one of the number and width of each subresolution feature, the distance between a subresolution feature and the portion, and the width of the portion are determined according to the width of an area of the desired pattern adjacent to the portion.

10. Method according to claim 1, wherein direct writing is performed by lithography.

11. Method according to claim 1, wherein the particle beam is selected from the group consisting in an electron beam and an ion beam.

* * * * *